United States Patent
Jang et al.

(10) Patent No.: US 9,300,513 B2
(45) Date of Patent: Mar. 29, 2016

(54) SIGNAL TRANSMISSION DEVICE ADJUSTING ELECTRICAL CHARACTERISTIC VALUE CORRESPONDING TO LOGIC LEVEL AND SIGNAL TRANSMITTING METHOD THEREOF

(71) Applicant: Electronics and Telecommunications Research Institute, Daejeon (KR)

(72) Inventors: Seunghyun Jang, Daejeon (KR); Young Kyun Cho, Daejeon (KR); Sung Jun Lee, Daejeon (KR); Bong Hyuk Park, Daejeon (KR); Jae Ho Jung, Daejeon (KR); Kwangchun Lee, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 14/595,653

(22) Filed: Jan. 13, 2015

(65) Prior Publication Data

US 2015/0215147 A1    Jul. 30, 2015

(30) Foreign Application Priority Data

Jan. 27, 2014 (KR) .................. 10-2014-0009753

(51) Int. Cl.
*H03C 3/00* (2006.01)
*H04L 27/26* (2006.01)
(Continued)

(52) U.S. Cl.
CPC .......... *H04L 27/2627* (2013.01); *H03F 1/3247* (2013.01); *H03F 3/24* (2013.01); *H04L 25/4923* (2013.01); *H04L 27/20* (2013.01); *H04L 27/368* (2013.01)

(58) Field of Classification Search
CPC ............................ H04L 27/2627; H04L 27/00
USPC ........................................................ 375/302
See application file for complete search history.

(56) References Cited

U.S. PATENT DOCUMENTS 4,700,151 A * 10/1987 Nagata ........................... 332/123
6,072,364 A *  6/2000 Jeckeln et al. ................. 330/149
(Continued)

OTHER PUBLICATIONS

Young Yun Woo et al., "Adaptive Digital Feedback Predistortion Technique for Linearizing Power Amplifiers", IEEE Transactions on Microwave Theory and Techniques, vol. 55, No. 5, pp. 932-940, May 2007.

(Continued)

*Primary Examiner* — Juan A Torres
(74) *Attorney, Agent, or Firm* — NSIP Law

(57) ABSTRACT

Provided is a signal transmission device including a first modulation unit generating a first modulated signal having at least three logic levels by modulating an input signal; a characteristic adjustment unit generating an adjusted first modulated signal by adjusting the at least one of electrical characteristic values based on an adjustment signal; a second modulation unit generating a second modulated signal by modulating the adjusted first modulated signal; and an adjustment operation unit generating the adjustment signal based on electrical characteristic values respectively corresponding to the at least three logic levels of the first modulated signal and corresponding to at least three logic levels of the second modulated signal. Linearity of the modulated signal generated by the provided signal transmission device is enhanced.

13 Claims, 14 Drawing Sheets

(51) Int. Cl.
*H04L 27/20* (2006.01)
*H04L 25/49* (2006.01)
*H04L 27/36* (2006.01)
*H03F 1/32* (2006.01)
*H03F 3/24* (2006.01)

(56) References Cited

U.S. PATENT DOCUMENTS

| | | | | |
|---|---|---|---|---|
| 6,587,514 B1 * | 7/2003 | Wright et al. | | 375/296 |
| 6,937,669 B2 * | 8/2005 | Tomerlin et al. | | 375/297 |
| 6,943,627 B2 * | 9/2005 | Leyonhjelm et al. | | 330/149 |
| 7,136,628 B2 * | 11/2006 | Yang et al. | | 455/114.3 |
| 7,904,033 B1 * | 3/2011 | Wright et al. | | 455/114.2 |
| 7,990,214 B2 * | 8/2011 | Markowski | | 330/136 |
| 8,185,065 B2 * | 5/2012 | McCallister et al. | | 455/114.2 |
| 8,446,979 B1 * | 5/2013 | Yee | | 375/296 |
| 8,478,210 B2 * | 7/2013 | Gandhi et al. | | 455/114.3 |
| 8,633,769 B2 * | 1/2014 | Bai et al. | | 330/149 |
| 8,837,620 B2 * | 9/2014 | Ho et al. | | 375/267 |
| 8,958,498 B1 * | 2/2015 | Lee et al. | | 375/286 |
| 2003/0058959 A1 * | 3/2003 | Rafie et al. | | 375/296 |
| 2003/0179829 A1 * | 9/2003 | Pinckley et al. | | 375/295 |
| 2009/0146736 A1 * | 6/2009 | Kim et al. | | 330/149 |
| 2010/0225390 A1 * | 9/2010 | Brown et al. | | 330/149 |
| 2011/0051785 A1 * | 3/2011 | Kenington et al. | | 375/219 |
| 2012/0025909 A1 | 2/2012 | Jo et al. | | |
| 2013/0077713 A1 * | 3/2013 | Kim et al. | | 375/297 |
| 2014/0294120 A1 * | 10/2014 | Gandhi et al. | | 375/297 |

OTHER PUBLICATIONS

Nazim Ceylan et al., "Optimization of EDGE Terminal Power Amplifiers Using Memoryless Digital Predistortion", IEEE Transactions on Microwave Theory and Techniques, vol. 53, No. 2, pp. 515-522, Feb. 2005.

* cited by examiner

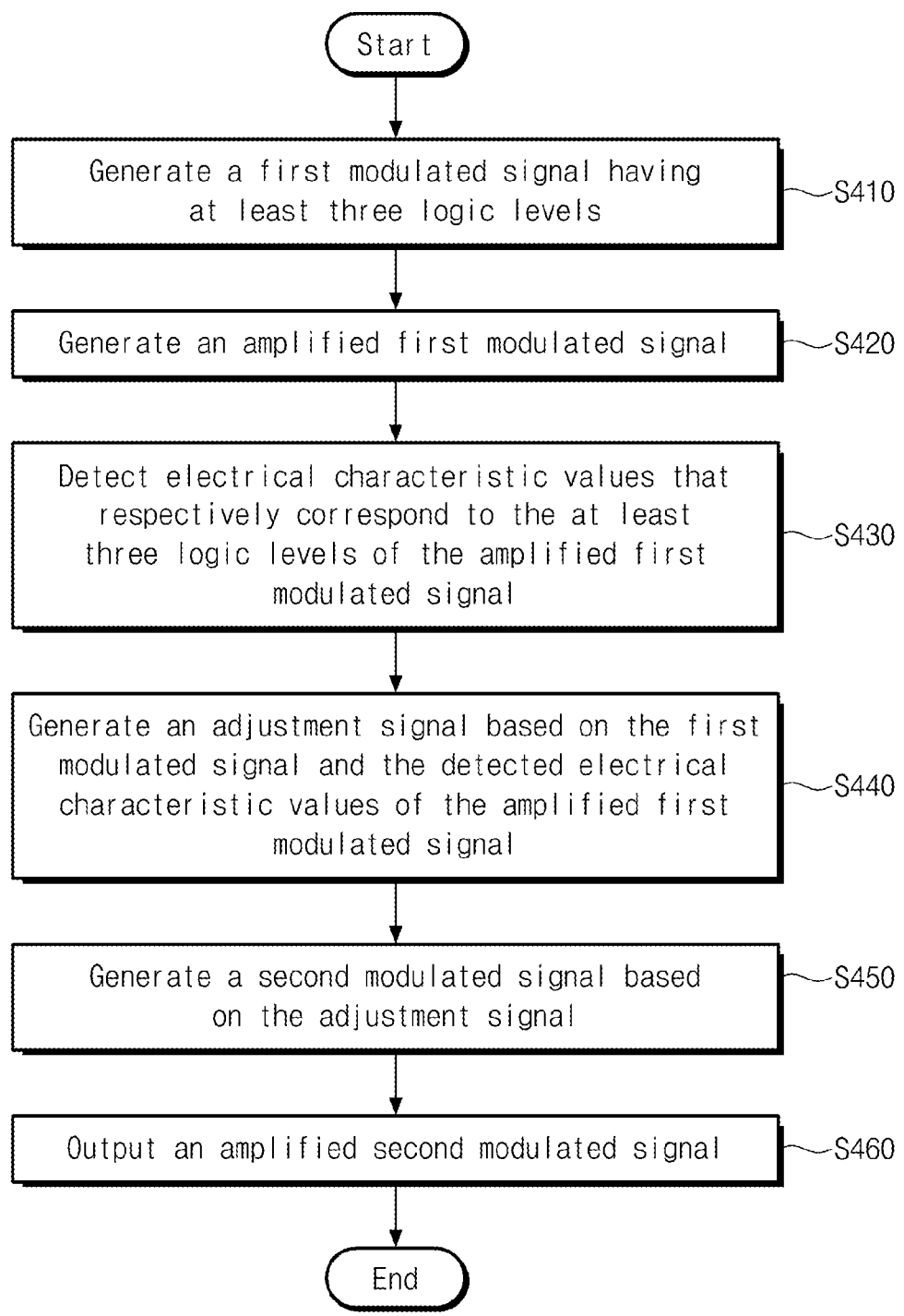

SIGNAL TRANSMISSION DEVICE ADJUSTING ELECTRICAL CHARACTERISTIC VALUE CORRESPONDING TO LOGIC LEVEL AND SIGNAL TRANSMITTING METHOD THEREOF

CROSS-REFERENCE TO RELATED APPLICATIONS

This U.S. non-provisional patent application claims priority under 35 U.S.C. §119 of Korean Patent Application No. 10-2014-0009753, filed on Jan. 27, 2014, the entire contents of which are hereby incorporated by reference.

BACKGROUND OF THE INVENTION

1. Technical Field

The inventive concept disclosed herein relates to signal processing, and more particularly, to a signal transmitting device adjusting an electrical characteristic value corresponding logic level and a signal transmitting method thereof.

2. Description of the Related Art

Recently, various wireless communications are provided based on an Orthogonal Frequency Division Multiplexing (OFDM) method. The OFDM method divides one data string into a plurality of data strings, and modulates each of the plurality of data strings based on a plurality of carrier signals that are orthogonal to each other. For example, Long Term Evolution (LTE), Worldwide Interoperability for Microwave Access (WiMAX), and Wireless Broadband Internet (Wibro) are communication methods that are based on the OFDM method. According to the OFDM method, mobile communications having fast speed are possible and the efficiency of frequency bandwidth utilization is improved.

However, unlike a Global System for Mobile Communication (GSM) method or a Code Division Multiple Access (CDMA) method, according to the OFDM method, a peak-to-average power ratio of a communication system is increased. That is, according to the OFDM method, since a plurality of modulated signals is transmitted simultaneously, a level of a transmitted signal varies greatly. Thus, according to the OFDM method, the efficiency of a power amplifier included in a transmitter is reduced. Various transmitter structures and transmission methods are suggested in order to overcome the above issues, and a carrier bursting transmitter is one of them.

For example, in the carrier bursting transmitter, a signal (hereinafter referred to as an envelope signal) corresponding to envelope information of a transmitted signal is modulated into a signal having a plurality of logic levels. The modulated signal is re-modulated together with a signal corresponding to phase information of the transmitted signal. The re-modulated signal is amplified by a power amplifier. The power amplifier has a nonlinear output characteristic in general. In order to obtain high efficiency, a typical power amplifier processes a signal having high power in a saturation region. Accordingly, the amplification factor of a signal having high power is less than that of a signal having low power.

If an envelope signal is modulated into a signal having two logic levels (for example, logic '0' and logic '1'), the linearity of the modulated signal is not degraded greatly. However, if an envelope signal is modulated into a signal having three or more logic levels, since each logic level has different power, the amplification factor of each signal may vary in each signal interval corresponding to different logic levels. Therefore, the linearity of the modulated signal may be degraded. In order to deal with the above issue, various transmitter structures are suggested. However, according to the suggested transmitter structures, a transmitter requires additional circuits and its power consumption is increased and its efficiency performance is deteriorated.

SUMMARY OF THE INVENTION

The inventive concept provides a signal transmission device and a signal transmitting method for amplifying a modulated signal having at least three logic levels while maintaining the linearity of the modulated signal. In particular, the signal transmitting device may adjust at least one of electrical characteristic values that respectively correspond to at least three logic levels of the modulated signal.

Embodiments of the inventive concept provide a signal transmission device including a first modulation unit configured to generate a first modulated signal having at least three logic levels by modulating an input signal; a characteristic adjustment unit configured to generate an adjusted first modulated signal by adjusting at least one of electrical characteristic values respectively corresponding to the at least three logic levels of the first modulated signal, based on an adjustment signal; a second modulation unit configured to generate a second modulated signal by modulating the adjusted first modulated signal based on a carrier signal; a power amplification unit configured to amplify power of the second modulated signal to output an amplified second modulated signal; and an adjustment operation unit configured to generate the adjustment signal based on the electrical characteristic values respectively corresponding to the at least three logic levels of the first modulated signal and electrical characteristic values respectively corresponding to at least three logic levels of the amplified second modulated signal.

In some embodiments, the first modulation unit is configured to generate the first modulated signal by using at least one of delta-sigma modulation and pulse width modulation.

In other embodiments, the characteristic adjustment unit is configured to adjust the at least one of the electrical characteristic values respectively corresponding to the at least three logic levels of the first modulated signal such that a ratio of differences between each of the electrical characteristic values respectively corresponding to the at least three logic levels of the amplified second modulated signal is being same as a ratio of differences between each of the electrical characteristic values respectively corresponding to the at least three logic levels of the first modulated signal, based on the adjustment signal.

In still other embodiments, the first modulated unit is further configured to receive a signal corresponding to amplitude information of the input signal, and the second modulation unit is further configured to receive a signal corresponding to phase information of the input signal.

In even other embodiments, the signal transmission device further includes an initial-characteristic-providing unit configured to provide the electrical characteristic values respectively corresponding to the at least three logic levels of the first modulated signal to the adjustment operation unit.

In yet other embodiments, the initial-characteristic-providing unit includes an initial characteristic detector configured to detect the electrical characteristic values respectively corresponding to the at least three logic levels of the first modulated signal.

In further embodiments, the initial-characteristic-providing unit includes a look-up table configured to store the electrical characteristic values respectively corresponding to the at least three logic levels of the first modulated signal.

In still further embodiments, at least one of the electrical characteristic values stored in the look-up table is updated based on at least one of the adjustment signal and the adjusted first modulated signal.

In even further embodiments, the signal transmission device further includes an output characteristic detection unit configured to detect the electrical characteristic values respectively corresponding to the at least three logic levels of the amplified second modulated signal.

Embodiments of the inventive concept provide a signal transmitting method including generating a first modulated signal having at least three logic levels by modulating an input signal; amplifying power of the first modulated signal to generate an amplified first modulated signal; generating an adjustment signal based on electrical characteristic values respectively corresponding to the at least three logic levels of the first modulated signal and electrical characteristic values respectively corresponding to at least three logic levels of the amplified first modulated signal; generating a second modulated signal by adjusting at least one of the electrical characteristic values respectively corresponding to the at least three logic levels of the first modulated signal, based on the adjustment signal; and amplifying power of the second modulated signal to output an amplified second modulated signal.

In some embodiments, the generating the second modulated signal includes adjusting the at least one of the electrical characteristic values respectively corresponding to the at least three logic levels of the first modulated signal such that a ratio of differences between each of the electrical characteristic values respectively corresponding to the at least three logic levels of the amplified first modulated signal is being same as a ratio of differences between each of the electrical characteristic values respectively corresponding to the at least three logic levels of the first modulated signal, based on the adjustment signal.

In other embodiments, the signal transmitting method further includes detecting the electrical characteristic values respectively corresponding to the at least three logic levels of the first modulated signal, wherein the adjustment signal is generated based on the detected electrical characteristic values.

In still other embodiments, the electrical characteristic values respectively corresponding to the at least three logic levels of the first modulated signal are previously stored before the adjustment signal is generated, wherein the adjustment signal is generated based on the stored electrical characteristic values.

In even other embodiments, the signal transmitting method further includes updating at least one of the stored electrical characteristic values based on at least one of the adjustment signal and the second modulated signal.

In yet other embodiments, the signal transmitting method further includes detecting the electrical characteristic values respectively corresponding to the at least three logic levels of the amplified first modulated signal, wherein the adjustment signal is generated based on the detected electrical characteristic values.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIGS. 11 to 14 are flowcharts illustrating a signal transmitting method according to another embodiment of the inventive concept.

DETAILED DESCRIPTION OF PREFERRED EMBODIMENTS

The above-described characteristics and the following detailed description are merely examples for helping the understanding of the inventive concept. That is, the inventive concept may be embodied in different forms and should not be constructed as limited to the embodiments set forth herein. The following embodiments are merely examples for completely disclosing the inventive concept and for delivering the inventive concept to those skilled in the art that the inventive concept belongs. Therefore, in the case where there are multiple methods for implementing the elements of the inventive concept, the inventive concept may be implemented with any of the methods or an equivalent thereof.

When it is mentioned that a certain configuration includes a specific element or a certain process includes a specific step, another element or another step may be further included. That is, the terms used herein are not for limiting the concept of the inventive concept, but for describing a specific embodiment. Furthermore, the embodiments described herein include complementary embodiments thereof.

The terms used herein have meanings that are generally understood by those skilled in the art. The commonly used terms should be consistently interpreted according to the context of the specification. Furthermore, the terms used herein should not be interpreted as overly ideal or formal meanings, unless the meanings of the terms are clearly defined. Hereinafter, the embodiments of the inventive concept will be described with reference to the accompanying drawings.

Figure 1:
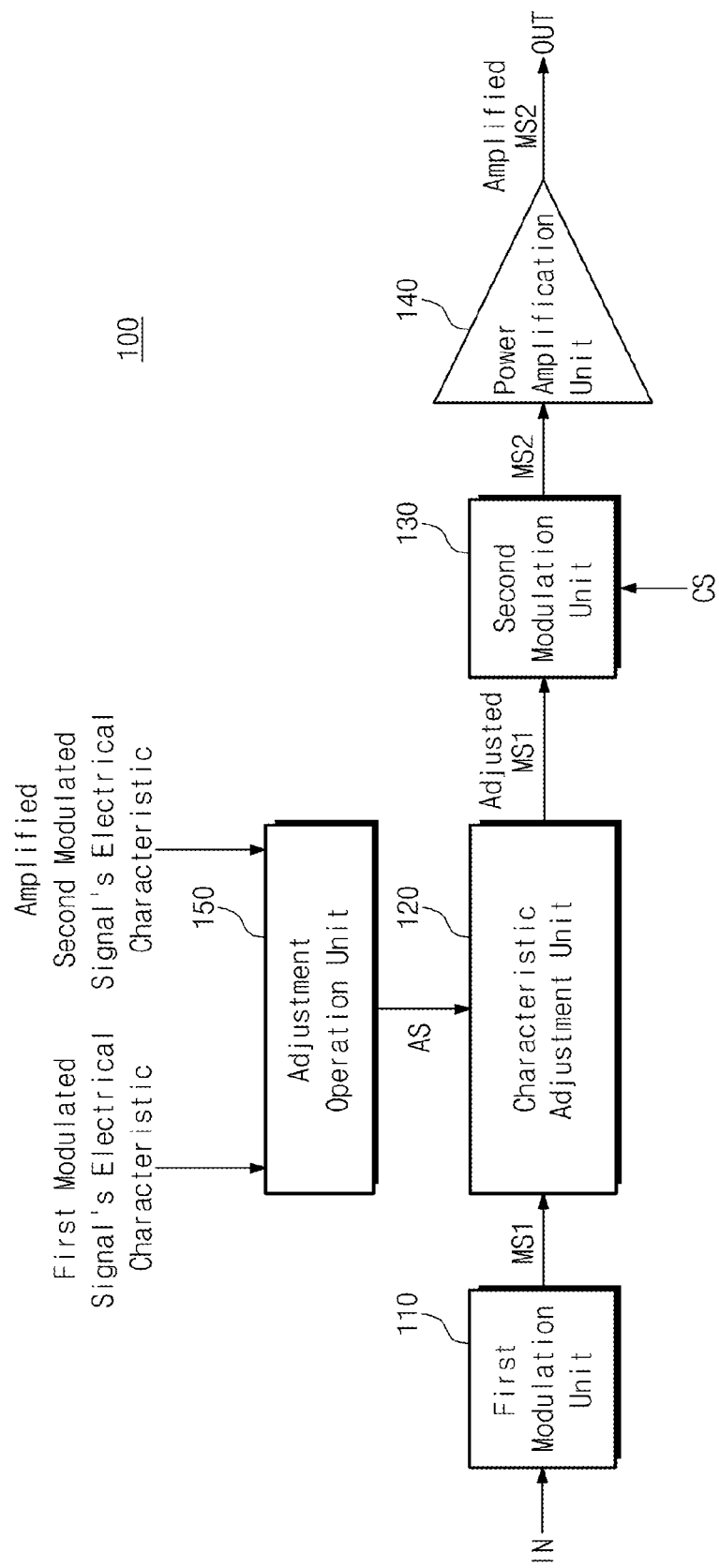
FIG. 1 is a block diagram illustrating a configuration of a signal transmission device according to an embodiment of the inventive concept.

FIG. 1 is a block diagram illustrating a configuration of a signal transmission device 100 according to an embodiment of the inventive concept. The signal transmission device 100 includes a first modulation unit 110, a characteristic adjustment unit 120, a second modulation unit 130, a power amplification unit 140, and an adjustment operation unit 150.

The first modulation unit 110 may receive an input signal IN. The first modulation unit 110 may generate a first modulated signal MS1 by modulating the input signal IN. According to an embodiment of the inventive concept, the first modulated signal MS1 may have at least three logic levels. According to an embodiment of the inventive concept, the first modulation unit 110 may generate the first modulated signal MS1 by using delta-sigma modulation. According to another embodiment of the inventive concept, the first modulation unit 110 may generate the first modulated signal MS1 by using pulse width modulation. The first modulated signal MS1 may be generated by using at least two different modulation methods simultaneously. A signal modulated by the first modulation unit 110 may be demodulated to a signal having the same characteristic as the input signal IN. For example, when the first modulated signal MS1 is generated by at least one of delta-signal modulation and pulse width modulation, a signal-receiving device (not shown) may demodulate the first modulated signal MS1 by signal filtering. Thus, a signal having the same characteristic as the input signal IN may be obtained from the signal-receiving device.

The characteristic adjustment unit 120 may receive the first modulated signal MS1. Additionally, the characteristic adjustment unit 120 may adjust at least one of electrical characteristic values that respectively correspond to at least three logic levels of the first modulated signal MS1, based on an adjustment signal AS. For example, the electrical characteristic may be voltage or current. That is, a signal having a specific voltage value or a specific current value may be regarded as having a specific logic level. A process of adjusting electrical characteristic values that respectively correspond to at least three logic levels of the first modulated signal MS1 is described in detail with reference to FIGS. 2 and 3. The characteristic adjustment unit 120 may generate an adjusted first modulated signal MS1 according to the above signal processing.

The second modulation unit 130 may receive the adjusted first modulated signal MS1. Additionally, the second modulation unit 130 may receive a carrier signal CS. The second modulation unit 130 may modulate the adjusted first modulated signal MS1 based on the carrier signal CS. The second modulation unit 130 may generate a second modulated signal MS2 with various modulation methods, based on a modulation result. According to an embodiment of the inventive concept, the second modulation unit 130 may generate the second modulated signal MS2 by using phase modulation. However, the inventive concept is not limited thereto. For example, the second modulation unit 130 may generate the second modulated signal MS2 by using frequency modulation. The second modulated signal MS2 may have at least three logic levels, like the first modulated signal MS1.

The power amplification unit 140 may receive the second modulated signal MS2. The power amplification unit 140 may amplify the power of the second modulated signal MS2 and then may output the amplified second modulated signal MS2. The power amplification unit 140 may have a nonlinear output characteristic. In order to obtain high efficiency, the power amplification unit 140 may process a signal having high power in a saturation region. On the other hand, the power amplification unit 140 may process a signal having low power in a linear region. However, each of at least three logic levels of the second modulated signal MS2 may have different power. Accordingly, the amplification factor of each signal may vary in each signal interval corresponding to different logic levels. As a result, the linearity of the amplified second modulated signal MS2 may be degraded. According to an embodiment of the inventive concept, in order to resolve the above issue, the characteristic adjustment unit 120 and the adjustment operation unit 150 are used. A process of maintaining the linearity of the amplified second modulated signal MS2 is described in more detail with reference to FIGS. 2 and 3.

The adjustment operation unit 150 may receive electrical characteristic values that respectively correspond to at least three logic levels of the first modulated signal MS1. Furthermore, the adjustment operation unit 150 may receive electrical characteristic values that respectively correspond to at least three logic levels of the amplified second modulated signal MS2. However, the electrical characteristic values may be previously stored in the adjustment operation unit 150. That is, the illustration shown in FIG. 1 does not limit the inventive concept and is an example for helping understanding the inventive concept. The adjustment operation unit 150 may generate an adjustment signal AS based on provided or stored electrical characteristic values. As mentioned above, the adjustment signal AS may be generated to adjust at least one of electrical characteristic values that respectively correspond to at least three logic levels of the first modulated signal MS1. A process of adjusting electrical characteristic values that respectively correspond to at least three logic levels of the first modulated signal MS1 is described in detail with reference to FIGS. 2 and 3.

Figure 2:
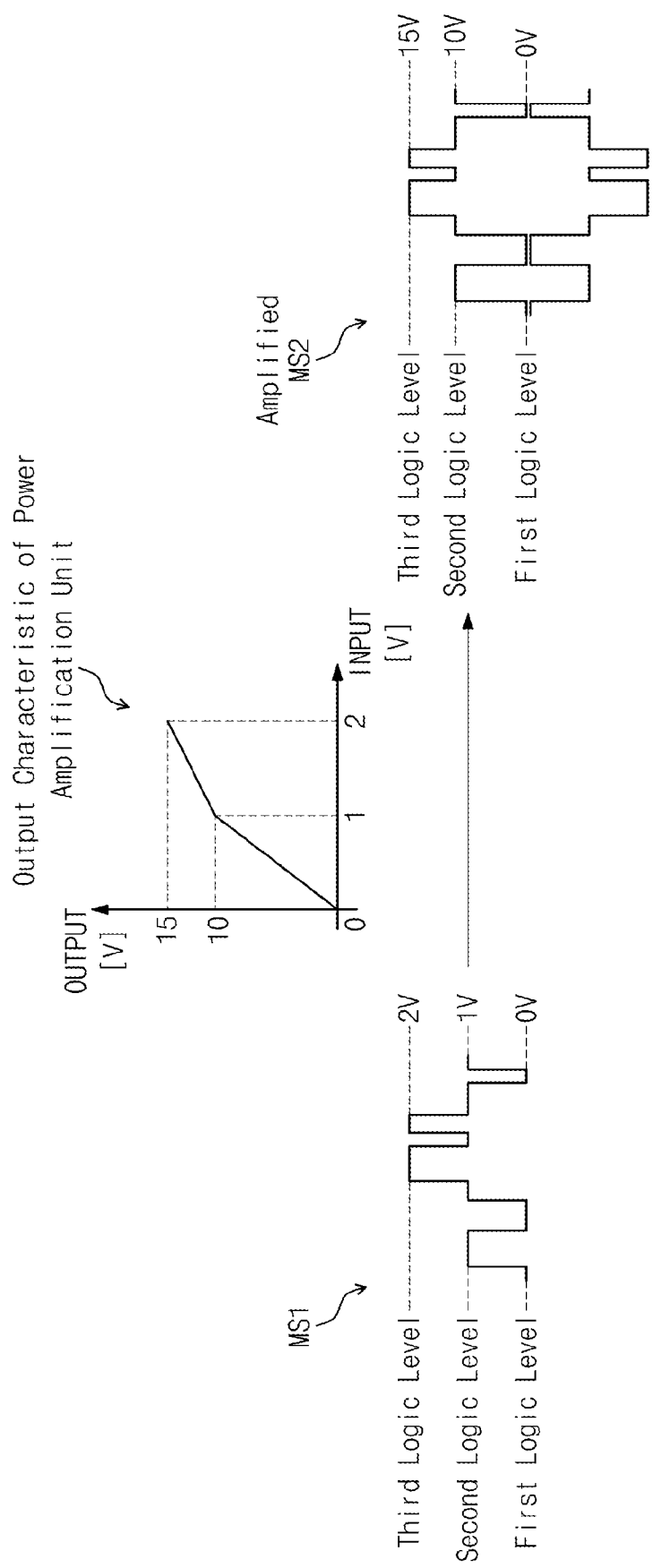
FIGS. 2 and 3 are conceptual diagrams illustrating a process of adjusting at least one of electrical characteristic values that respectively correspond to at least three logic levels of a modulated signal.
Figure 3:
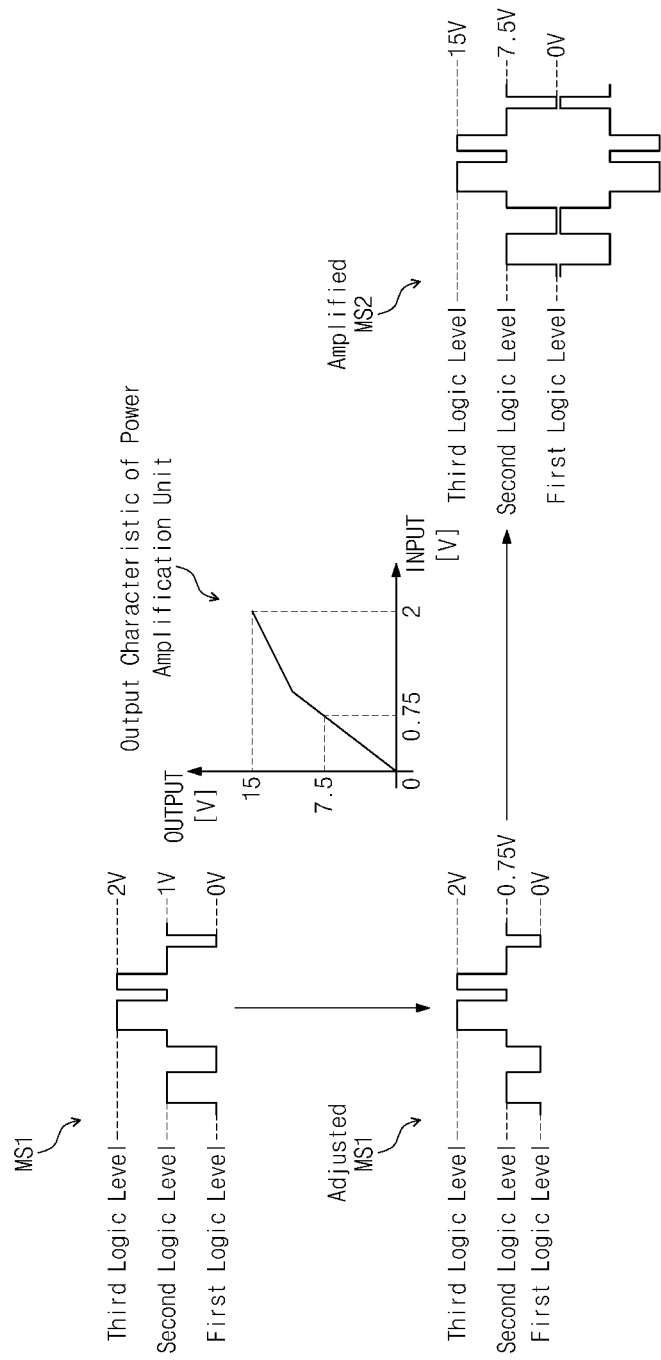

FIGS. 2 and 3 are conceptual diagrams illustrating a process of adjusting at least one of electrical characteristic values that respectively correspond to at least three logic levels of a modulated signal. In more detail, FIG. 2 illustrates the case where an embodiment of the inventive concept is not applied, and FIG. 3 illustrates the case where an embodiment of the inventive concept is applied. In FIGS. 2 and 3, it is assumed that the modulated signal has three logic levels. However, the assumption is for convenience of description and description of inventive concept and does not limit the inventive concept. It is apparent to those skilled in the art that even when a modulated signal has four or more logic levels, descriptions of the same contexts as those of FIGS. 2 and 3 are applied.

First, FIG. 2 is referred. A form that the first modulated signal MS1 may have is shown in FIG. 2. The first modulated signal MS1 has three logic levels. In order to help understanding the inventive concept, it is assumed that a first logic level corresponds to a voltage value of 0V; a second logic level corresponds to a voltage value of 1V; and a third logic level corresponds to a voltage of 2V. The first modulated signal MS1 may have one of voltages values that respectively correspond to the first to third logic levels according to time.

An output characteristic that the power amplification unit 140 of FIG. 1 may have is shown in FIG. 2. For example, it is assumed that a signal having a voltage value between 0V to 1V is amplified to a signal having a voltage value between 0V to 10V (i.e., a gain value is 10) by the power amplification unit 140. This amplification interval may correspond to a linear region. Then, it is further assumed that a signal having a voltage value between 1V to 2V is amplified to a signal having a voltage value between 10V to 15V (i.e., a gain value is 5) by the power amplification unit 140. The amplification interval may correspond to a saturation region. However, it is obvious that the output characteristic of the power amplification unit 140 shown in FIG. 2 is an example for helping understanding the inventive concept. The power amplification unit 140 may have an output characteristic different from that of FIG. 2.

A form that the amplified second modulated signal MS1 may have is shown in FIG. 2. The amplified second modulated signal MS2 also has three logic levels. Since the first logic level of the first modulated signal MS1 corresponds to a voltage value of 0V, the amplified first logic level corresponds to a voltage value of 0V. Since the second logic level of the first modulated signal MS1 corresponds to a voltage value of 1V, the amplified second logic level corresponds to a voltage value of 10V. Furthermore, since the third logic level of the first modulated signal MS1 corresponds to a voltage value of 2V, the amplified third logic level corresponds to a voltage value of 15V.

Referring to FIG. 2, the three logic levels of the first modulated signal MS1 correspond to voltage values of 0V, 1V, and 2V, respectively. A ratio of the voltage values that respectively correspond to the first to third logic levels of the first modulated signal MS1 is 0:1:2. On the other hand, the three logic levels of the amplified second modulated signal MS2 correspond to voltage values of 0V, 10V, and 15V, respectively. A ratio of the voltage values that respectively correspond to the first to third logic levels of the amplified second modulated signal MS2 is 0:4/3:2. Since the power amplification unit 140 has a non-linear output characteristic, the amplification factor of a signal having high power is less than that of a signal having low power. That is, if an embodiment of the inventive concept is not applied, the linearity of the amplified second modulated signal MS2 may be deteriorated. Accordingly, in order to maintain the linearity, an embodiment of the inventive concept needs to be applied.

Then, FIG. 3 is referred. As an embodiment of the inventive concept, it is assumed that a voltage value corresponding to the second logic level of the first modulated signal MS1 is adjusted based on the adjustment signal AS of FIG. 1. On the basis of the adjustment signal AS, a voltage value corresponding to the second logic level of the first modulated signal MS1 is adjusted from 1V to 0.75V. By the above signal processing, the adjusted first modulated signal MS1 is generated. According to an output characteristic of the power amplification unit 140, a signal having a voltage value of 0.75V is amplified to a signal having a voltage value of 7.5V. Accordingly, the second logic level of the amplified second modulated signal MS2 corresponds to 7.5V.

Referring to FIG. 3, the three logic levels of the first modulated signal MS1 correspond to 0V, 1V, and 2V, respectively. Then, three logic levels of the amplified second modulated signal MS2 correspond to 0V, 7.5V, and 15V, respectively. A ratio of the voltage values that respectively correspond to the first to third logic levels of the amplified second modulated signal MS2 is 0:1:2. That is, when an embodiment of the inventive concept is applied, even though the power amplification unit 140 has a non-linear output characteristic, the linearity of the amplified second modulated signal MS2 is maintained.

Referring to FIG. 2, a ratio of 0V, 10V, and 15V, which are voltage values that respectively correspond to the first to third logic levels of the amplified second modulated signal MS2, is 0:4./3:2. In order to maintain the linearity of the amplified second modulated signal MS2, a voltage corresponding to the second logic level of the first modulated signal MS1 needs to be adjusted to 0.75V, which is ¾ of 1V. Referring to FIG. 3, by adjusting a voltage value corresponding to the second logic level of the first modulated signal MS1, a ratio of the voltage values that respectively correspond to the first to third logic levels of the amplified second modulated signal MS2 is adjusted to 0:1:2. On the basis of the adjustment signal AS, a ratio of voltage values that respectively correspond to the three logic levels of the first modulated signal MS1 and a ratio of voltage values that respectively correspond to the three logic levels of the amplified second modulated signal MS2 become identical. That is, the linearity of the amplified second modulated signal MS2 is maintained.

As an embodiment of the inventive concept, the adjustment operation unit 150 of FIG. 1 may receive 0V, 1V, and 2V, which are voltage values that respectively correspond to three logic levels of the first modulated signal MS1. Then, the adjustment operation unit 150 may receive 0V, 10V, and 15V, which are voltage values that respectively correspond to three logic levels of the amplified second modulated signal MS2. On the basis of provided voltage values, the adjustment operation unit 150 may determine that the linearity of the amplified second modulated signal MS2 is degraded. At this point, the adjustment operation unit 150 may generate an adjustment signal AS.

As an embodiment of the inventive concept, the adjustment operation unit 150 may generate an adjustment signal AS to reduce a voltage value corresponding to the second logic level of the first modulated signal MS1 by ¾. As another embodiment of the inventive concept, the adjustment operation unit 150 may generate an adjustment signal AS to reduce a voltage value corresponding to the second logic level of the first modulated signal MS1 by a predetermined arbitrary value (for example, 0.01V). In this case, until the voltage value corresponding to the second logic level of the first modulated signal MS1 reaches 0.75V, the adjustment signal AS may be generated repeatedly. It is also possible that, even though the voltage value corresponding to the second logic level of the first modulated signal MS1 reaches 0.75V, the adjustment signal AS may be still generated repeatedly.

As mentioned above, the descriptions of FIGS. 2 and 3 are used for helping understanding the inventive concept. It is obvious that a type of an electrical characteristic corresponding to a logic level, an electrical characteristic value corresponding to a logic value, the number of logic levels, the position of a logic level being an adjustment target, the number of logic levels being adjustment targets, and format of an adjustment signal AS may be changed in various forms, as necessary.

As a result, in a signal transmission device of the inventive concept, the characteristic adjustment unit 120 of FIG. 1 may adjust at least one of electrical characteristic values that respectively correspond to at least three logic levels of the first modulated signal MS1, based on the adjustment signal AS, thereby a ratio of differences between each of electrical characteristic values that respectively correspond to at least three logic levels of the amplified second modulated signal MS2 may become identical to that of differences between each of electrical characteristic values that respectively correspond to at least three logic levels of the first modulated signal MS1. Accordingly, in the signal transmission device of the inventive concept, the linearity of an amplified modulated signal may be maintained.

Figure 4:
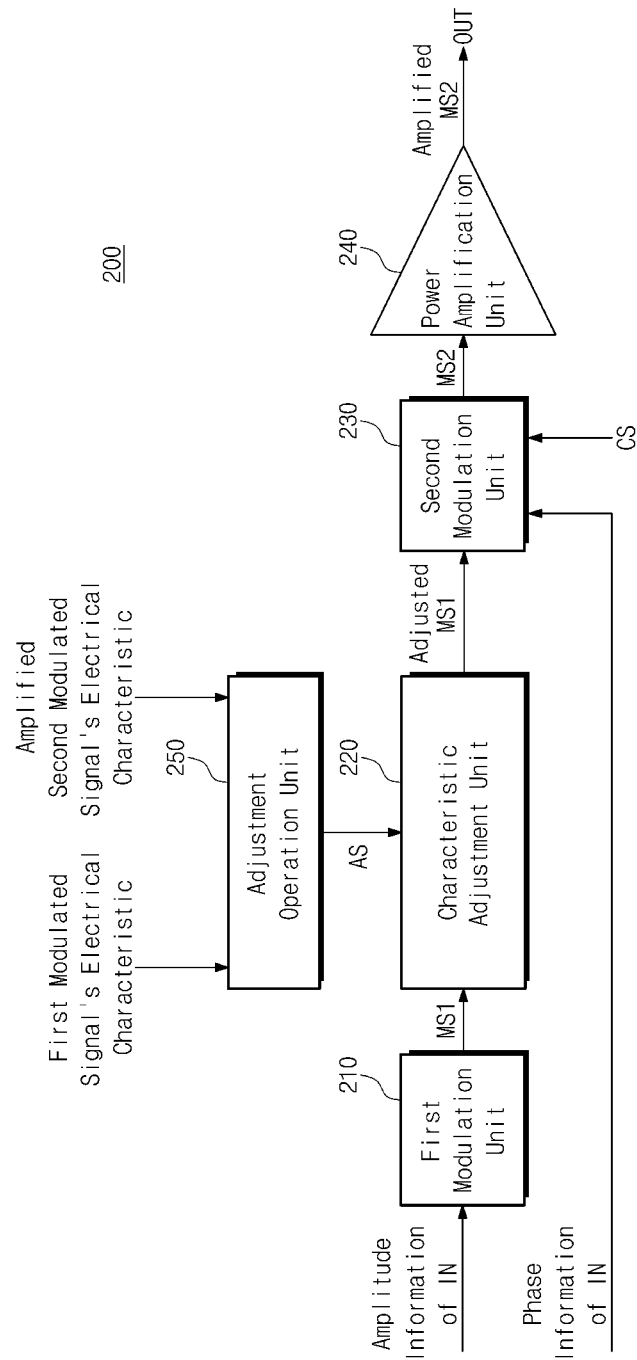
FIGS. 4 to 8 are block diagrams illustrating another configuration of a signal transmission device according to an embodiment of the inventive concept.

FIG. 4 is a block diagram illustrating a configuration of a signal transmission device 200 according to an embodiment of the inventive concept. The signal transmission device 200 includes a first modulation unit 210, a characteristic adjustment unit 220, a second modulation unit 230, a power amplification unit 240, and an adjustment operation unit 250. Configuration and functions of the first modulation unit 210, the characteristic adjustment unit 220, the second modulation unit 230, the power amplification unit 240, and the adjustment operation unit 250 may include configurations and functions of the first modulation unit 110, the characteristic adjustment unit 120, the second modulation unit 130, the power amplification unit 140, and the adjustment operation unit 150 of FIG. 1, respectively. Thus, in relation to the description of FIG. 1, overlapping descriptions on the first modulation unit 210, the characteristic adjustment unit 220, the second modulation unit 230, the power amplification unit 240, and the adjustment operation unit 250 are omitted.

An input signal IN may have amplitude and a phase. As an embodiment of the inventive concept, the amplitude information of the input signal IN may be provided to the first modulation unit 210. The first modulation unit 210 may generate a first modulated signal MS1 by using the amplitude information of the input signal IN. As an embodiment of the inventive concept, the phase information of the input signal IN may be provided to the second modulation unit 230. The second modulation unit 230 may generate a second modulated signal MS2 by using the phase information of the input signal IN and a carrier signal. However, this is just an embodiment, and the first modulated signal MS1 and the second modulated signal MS2 may be generated through different signal processing.

Figure 5:
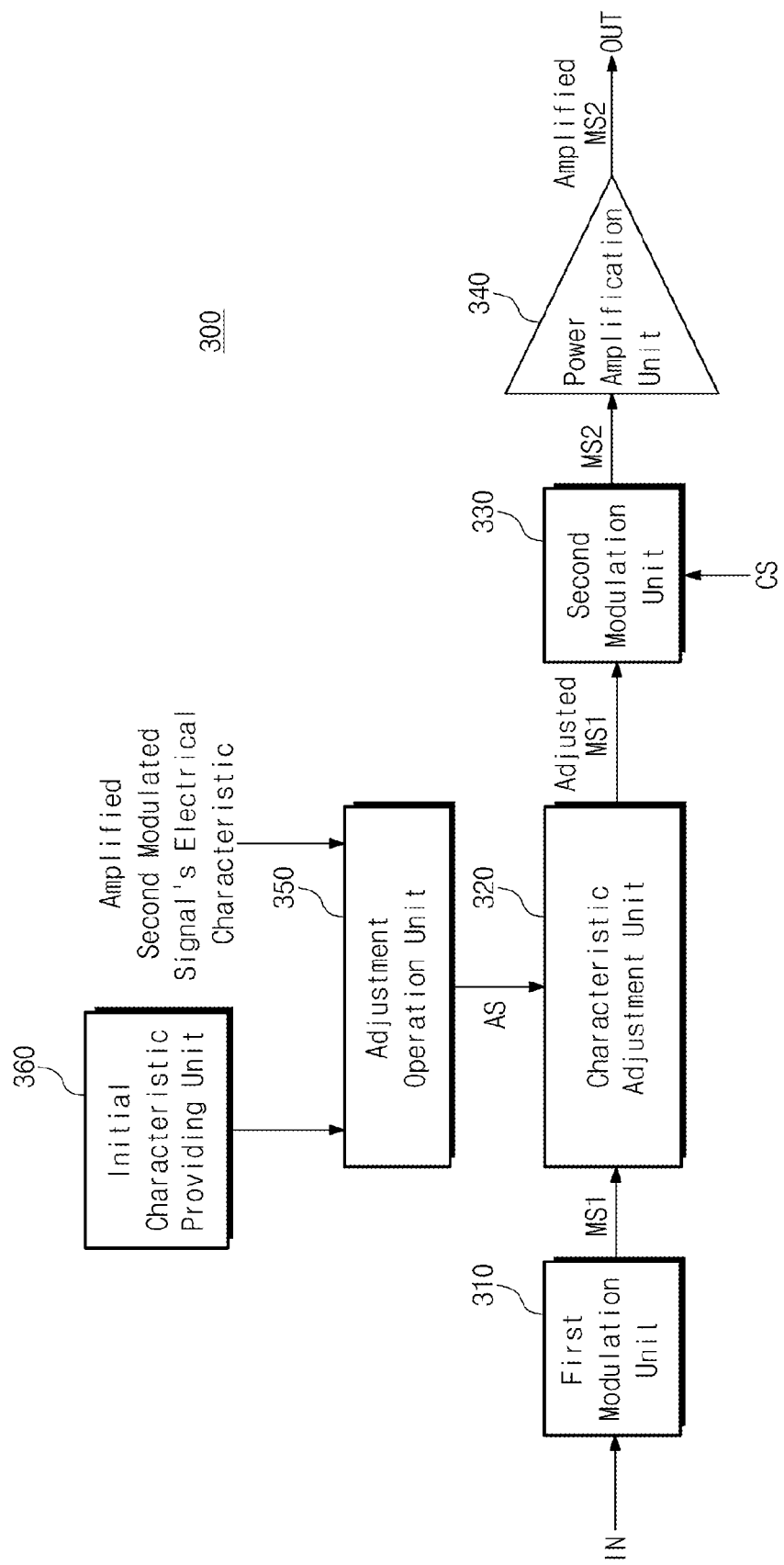

FIG. 5 is a block diagram illustrating a configuration of a signal transmission device 300 according to an embodiment of the inventive concept. The signal transmission device 300 includes a first modulation unit 310, a characteristic adjustment unit 320, a second modulation unit 330, a power amplification unit 340, an adjustment operation unit 350, and an initial-characteristic-providing unit 360. Configuration and functions of the first modulation unit 310, the characteristic adjustment unit 320, the second modulation unit 330, the power amplification unit 340, and the adjustment operation unit 350 may include configurations and functions of the first modulation unit 110, the characteristic adjustment unit 120, the second modulation unit 130, the power amplification unit 140, and the adjustment operation unit 150 of FIG. 1, respectively. Thus, in relation to the description of FIG. 1, overlapping descriptions on the first modulation unit 310, the characteristic adjustment unit 320, the second modulation unit 330, the power amplification unit 340, and the adjustment operation unit 350 are omitted.

The adjustment operation unit 350 may receive electrical characteristic values that respectively correspond to at least three logic levels of the first modulated signal MS1. The initial-characteristic-providing unit 360 may provide the electrical characteristic values that respectively correspond to at least three logic levels of the first modulated signal MS1 to the adjustment operation unit 350. As an embodiment of the inventive concept, the initial-characteristic-providing unit 360 may receive information with respect to the electrical characteristic values that respectively correspond to at least three logic levels of the first modulated signal MS1. As another embodiment of the inventive concept, the initial-characteristic-providing unit 360 may previously store the electrical characteristic values that respectively correspond to at least three logic levels of the first modulated signal MS1. An operation of the initial-characteristic-providing unit 360 is described in more detail with reference to FIGS. 6 and 7.

Figure 6:
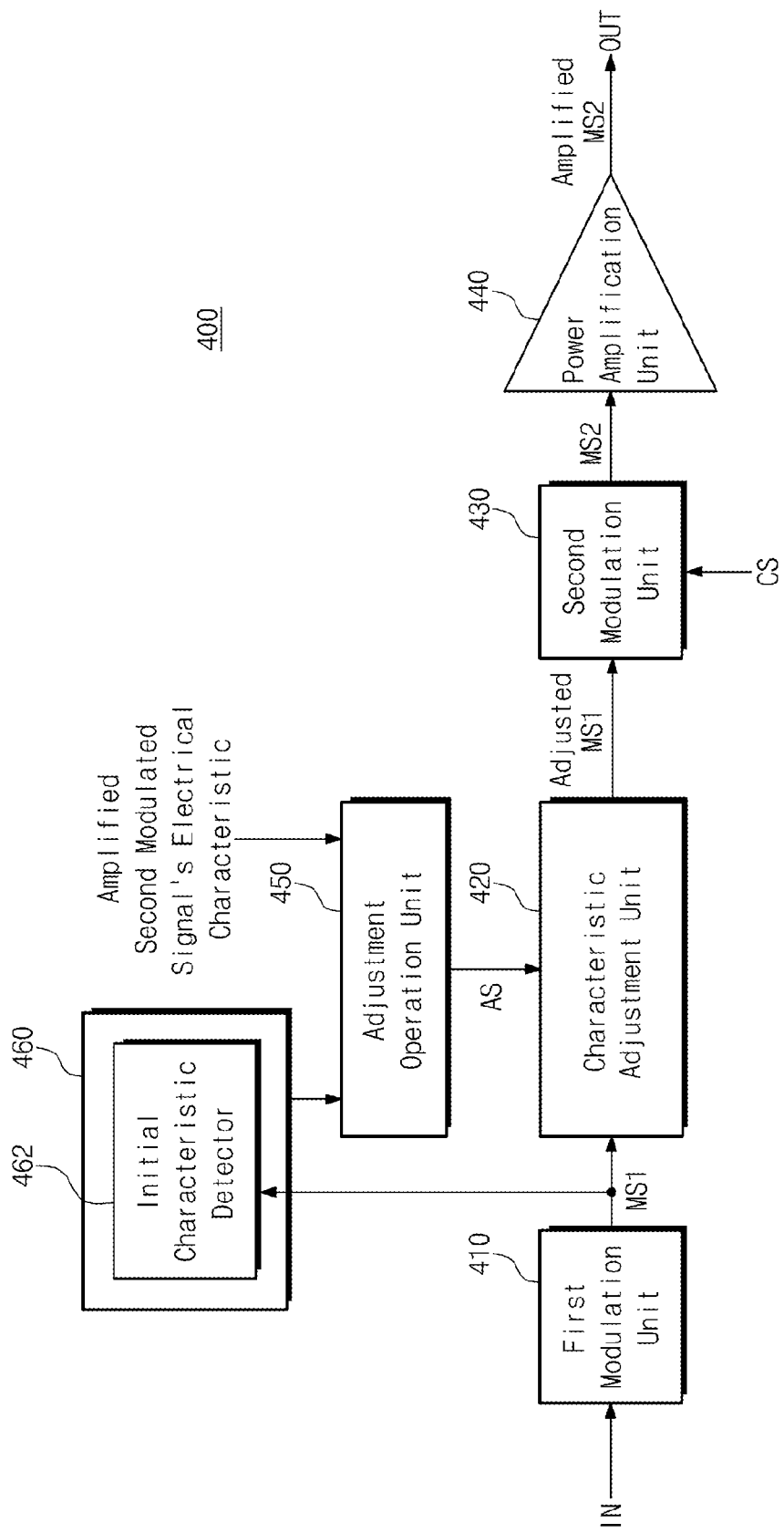

FIG. 6 is a block diagram illustrating a configuration of a signal transmission device 400 according to an embodiment of the inventive concept. The signal transmission device 400 includes a first modulation unit 410, a characteristic adjustment unit 420, a second modulation unit 430, a power amplification unit 440, an adjustment operation unit 450, and an initial-characteristic-providing unit 460. Configuration and functions of the first modulation unit 410, the characteristic adjustment unit 420, the second modulation unit 430, the power amplification unit 440, the adjustment operation unit 450, and the initial-characteristic-providing unit 460 may include configurations and functions of the first modulation unit 310, the characteristic adjustment unit 320, the second modulation unit 330, the power amplification unit 340, the adjustment operation unit 350, and the initial-characteristic-providing unit 360 of FIG. 5, respectively. Thus, in relation to the description of FIG. 5, overlapping descriptions on the first modulation unit 410, the characteristic adjustment unit 420, the second modulation unit 430, the power amplification unit 440, the adjustment operation unit 450, and the initial-characteristic-providing unit 460 are omitted.

The initial-characteristic-providing unit 460 may include an initial characteristic detector 462. The initial characteristic detector 462 may detect electrical characteristic values that respectively correspond to at least three logic levels of the first modulated signal MS1. As an embodiment, the initial characteristic detector 462 may be connected to an output terminal of the first modulation unit 410.

The electrical characteristic values may be detected through various methods. As an embodiment of the inventive concept, the initial characteristic detector 462 may be configured with a sampling circuit. In this embodiment, the initial characteristic detector 462 may detect voltage values that respectively correspond to at least three logic levels of the first modulated signal MS1 by tracing the level of the first modulated signal MS1. However, this is just an embodiment and the initial characteristic detector 462 may have a configuration different than the above embodiment.

The initial-characteristic-providing unit 460 may store the electrical characteristic values detected by the initial characteristic detector 462 in a storage region (not shown). The initial-characteristic-providing unit 460 may provide the stored electrical characteristic values to the adjustment operation unit 450. Alternatively, the initial-characteristic-providing unit 460 may not store the electrical characteristic values detected by the initial characteristic detector 462 and provide it to the adjustment operation unit 450 in real time.

Figure 7:
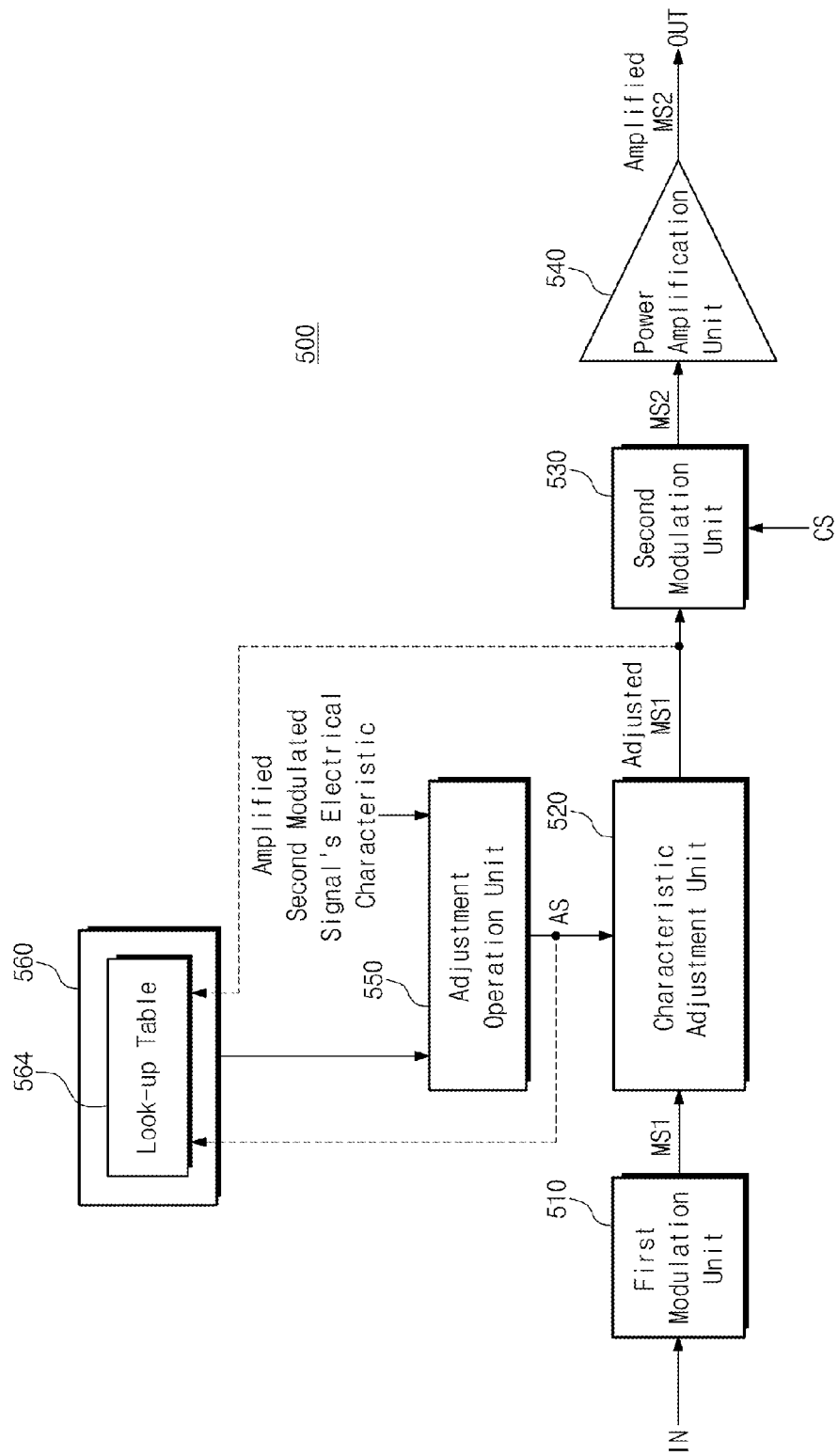

FIG. 7 is a block diagram illustrating a configuration of a signal transmission device 500 according to an embodiment of the inventive concept. The signal transmission device 500 includes a first modulation unit 510, a characteristic adjustment unit 520, a second modulation unit 530, a power amplification unit 540, an adjustment operation unit 550, and an initial-characteristic-providing unit 560. Configuration and functions of the first modulation unit 510, the characteristic adjustment unit 520, the second modulation unit 530, the power amplification unit 540, the adjustment operation unit 550, and the initial-characteristic-providing unit 560 may include configurations and functions of the first modulation unit 310, the characteristic adjustment unit 320, the second modulation unit 330, the power amplification unit 340, the adjustment operation unit 350, and the initial-characteristic-providing unit 360 of FIG. 5, respectively. Thus, in relation to the description of FIG. 5, overlapping descriptions on the first modulation unit 510, the characteristic adjustment unit 520, the second modulation unit 530, the power amplification unit 540, the adjustment operation unit 550, and the initial-characteristic-providing unit 560 are omitted.

The initial-characteristic-providing unit 560 may include a look-up table 564. The look-up table 564 may store electrical characteristic values that respectively correspond to at least three logic levels of the first modulated signal MS1. The look-up table 564 may be configured to previously store electrical characteristic values which are suitable for a design of the signal transmission device 500. A method of storing electrical characteristic values in the look-up table 564 may be changed as necessary. The initial-characteristic-providing unit 560 may provide the electrical characteristic values stored in the look-up table 564 to the adjustment operation unit 550.

The electrical characteristic values stored in the look-up table 564 may be maintained without change. Alternatively, as an embodiment of the inventive concept, the electrical characteristic values stored in the look-up table 564 may be updated at a scheduled time interval or in real time during an operation of the signal transmission device 500. The electrical characteristic values stored in the look-up table 564 may be updated based on an adjustment signal AS. That is, at least one of electrical characteristic values stored in the look-up table 564 may be adjusted by an amount that at least one of the electrical characteristic values respectively corresponding to at least three logic levels of the first modulated signal MS1 is adjusted based on the adjustment signal AS. Alternatively, the electrical characteristic values stored in the look-up table 564 may be updated based on the adjusted first modulated signal MS1. That is, the electrical characteristic values stored in the look-up table 564 may be replaced with electrical characteristic values respectively corresponding to at least three logic levels of the adjusted first modulated signal MS1. The electrical characteristic values stored in the look-up table 564 may be updated by referring to the adjustment signal AS and the adjusted first modulated signal MS1 simultaneously. Thus, even if an operation environment of the signal transmission device 500 is changed, an adjustment operation suitable for the changed operation environment may be performed.

Figure 8:
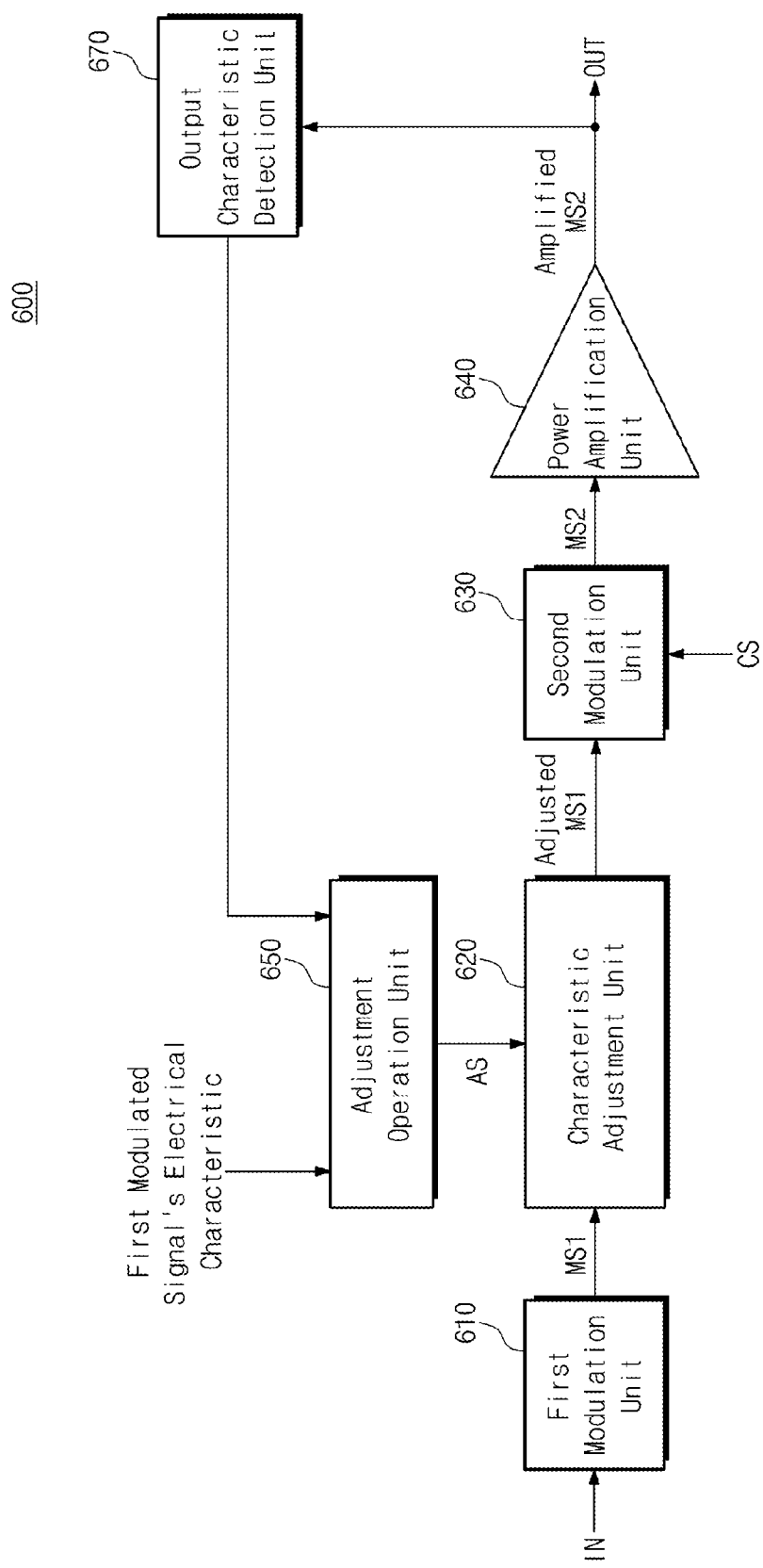

FIG. 8 is a block diagram illustrating a configuration of a signal transmission device 600 according to an embodiment of the inventive concept. The signal transmission device 600 includes a first modulation unit 610, a characteristic adjustment unit 620, a second modulation unit 630, a power amplification unit 640, an adjustment operation unit 650, and an output characteristic detection unit 660. Configuration and functions of the first modulation unit 610, the characteristic adjustment unit 620, the second modulation unit 630, the power amplification unit 640, and the adjustment operation unit 650 may include configurations and functions of the first modulation unit 110, the characteristic adjustment unit 120, the second modulation unit 130, the power amplification unit 140, and the adjustment operation unit 150 of FIG. 1, respectively. Thus, in relation to the description of FIG. 1, overlapping descriptions on the first modulation unit 610, the characteristic adjustment unit 620, the second modulation unit 630, the power amplification unit 640, and the adjustment operation unit 650 are omitted.

The adjustment operation unit 650 may receive electrical characteristic values that correspond to at least three logic levels of the amplified second modulated signal MS2. The output characteristic detection unit 670 may provide the electrical characteristic values that respectively correspond to at least three logic levels of the amplified second modulated signal MS2 to the adjustment operation unit 650. As an embodiment of the inventive concept, the output characteristic detection unit 670 may be connected to an output terminal of the power amplification unit 640.

The electrical characteristic values may be detected through various methods. As an embodiment of the inventive concept, the output characteristic detection unit 670 may be configured with a sampling circuit. In this embodiment, the output characteristic detection unit 670 may detect voltage values that respectively correspond to at least three logic levels of the amplified second modulated signal MS2 by tracing the level of the amplified second modulated signal MS2. However, this is just an embodiment and the output characteristic detection unit 670 may have a configuration different than the above embodiment.

The output characteristic detection unit 670 may store the detected electrical characteristic values in a storage region (not shown). The output characteristic detection unit 670 may provide the stored electrical characteristic values to the adjustment operation unit 650. Alternatively, the output characteristic detection unit 670 may not store the detected electrical characteristic values and provide it to the adjustment operation unit 650 in real time.

In the signal transmission device of the inventive concept, at least one of electrical characteristic values that respectively correspond to at least three logic levels of a modulated signal may be adjusted. Thus, the linearity of the modulated signal amplified by a power amplifier included in the signal transmission device may be maintained. In order to achieve this advantage, the signal transmission device of the inventive concept adjusts only an electrical characteristic value corresponding to a logic level of a modulated signal, instead of adjusting an entire input signal. Accordingly, the signal transmission device of the inventive concept may be implemented with a simpler configuration than a typical signal transmission device.

Figure 9:
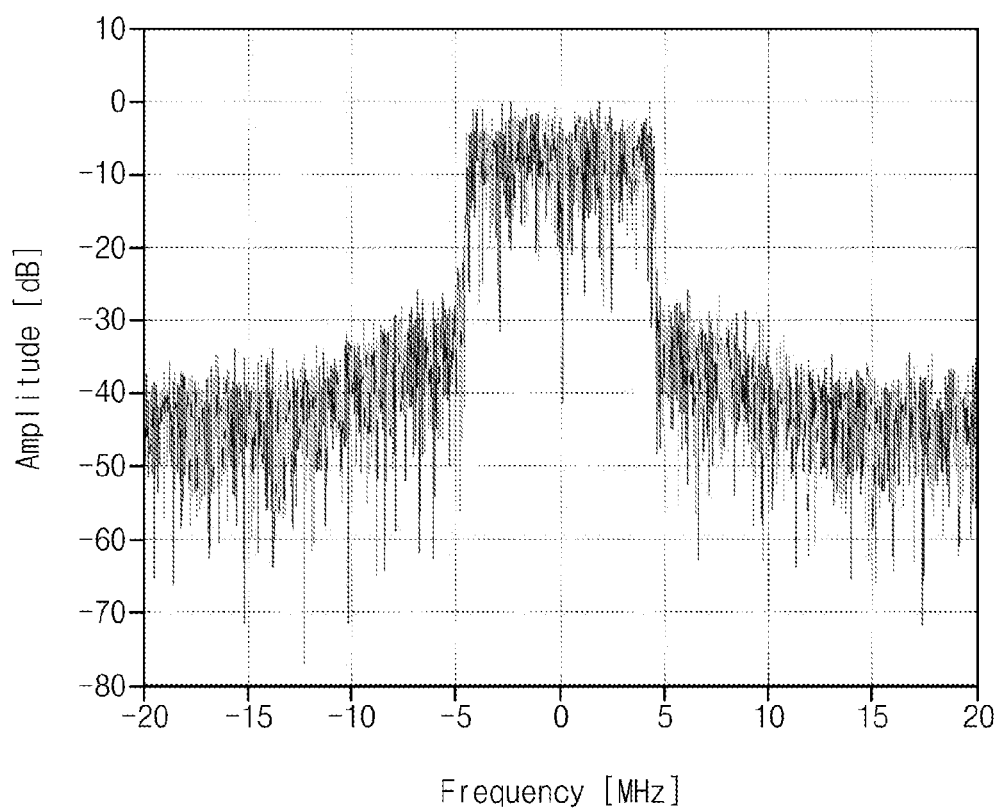
FIGS. 9 and 10 are graphs illustrating an effect obtained according to an embodiment of the inventive concept.
Figure 10:
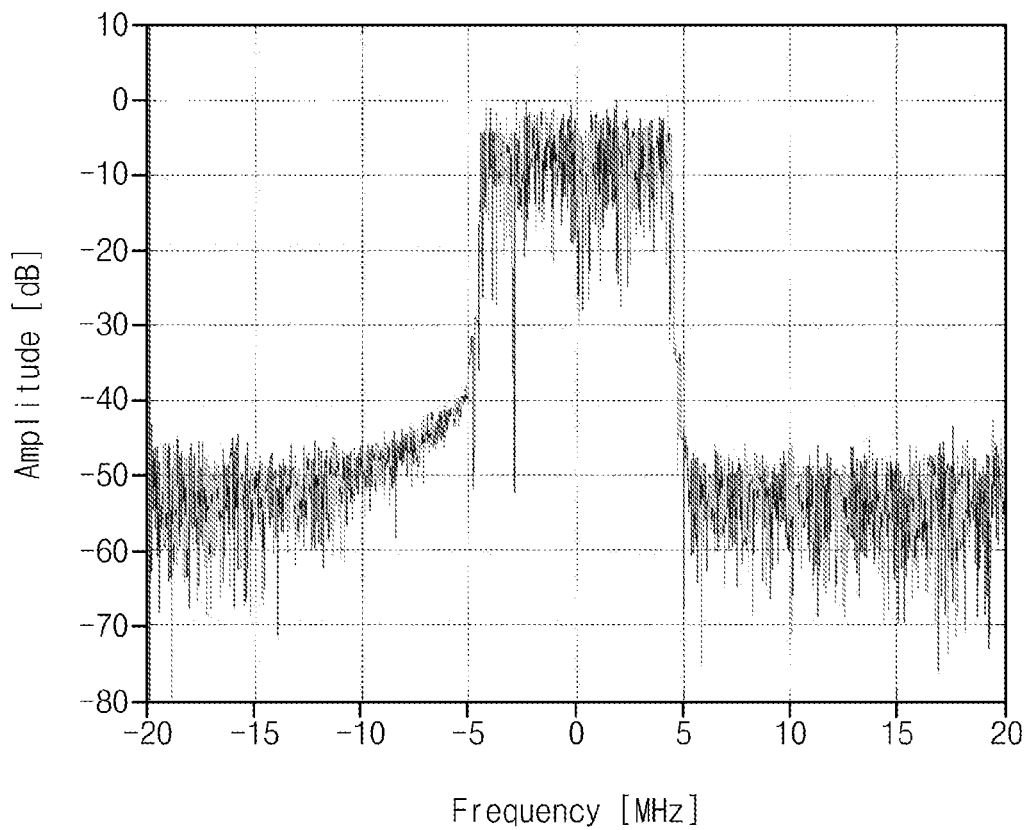

FIGS. 9 and 10 are graphs illustrating an effect obtained according to an embodiment of the inventive concept. In more detail, FIG. 9 is a graph illustrating the amplified second modulated signal MS2 of FIG. 1 when an embodiment of the inventive concept is not applied. FIG. 10 is a graph illustrating the amplified second modulated signal MS2 of FIG. 1 when an embodiment of the inventive concept is applied. In FIGS. 9 and 10, a horizontal axis designates a frequency component of a signal, and a vertical axis designates amplitude of a signal.

It is clearly shown that the amplified second modulated signal MS2 in FIG. 10 (i.e., in the case that the inventive concept is applied) reveals better linearity than that of the amplified second modulated signal MS2 in FIG. 9 (i.e., in the case that the inventive concept is not applied). If an embodiment of the inventive concept is not applied (i.e., in FIG. 9), the amplified second modulated signal MS2 having a frequency component of more than 5 MHz has amplitude of more than −40 dB in general. On the other hand, when an embodiment of the inventive concept is applied (i.e., in FIG. 10), the amplified second modulated signal MS2 having a frequency component of more than 5 MHz has amplitude of less than −40 dB. That is, the amplified second modulated signal MS2 includes a less amount of a non-linear component when an embodiment of the inventive concept is applied, as compared to when an embodiment of the inventive concept is not applied. Once an embodiment of the inventive concept is applied, the linearity of the amplified second modulated signal MS2 may not be degraded.

Figure 11:
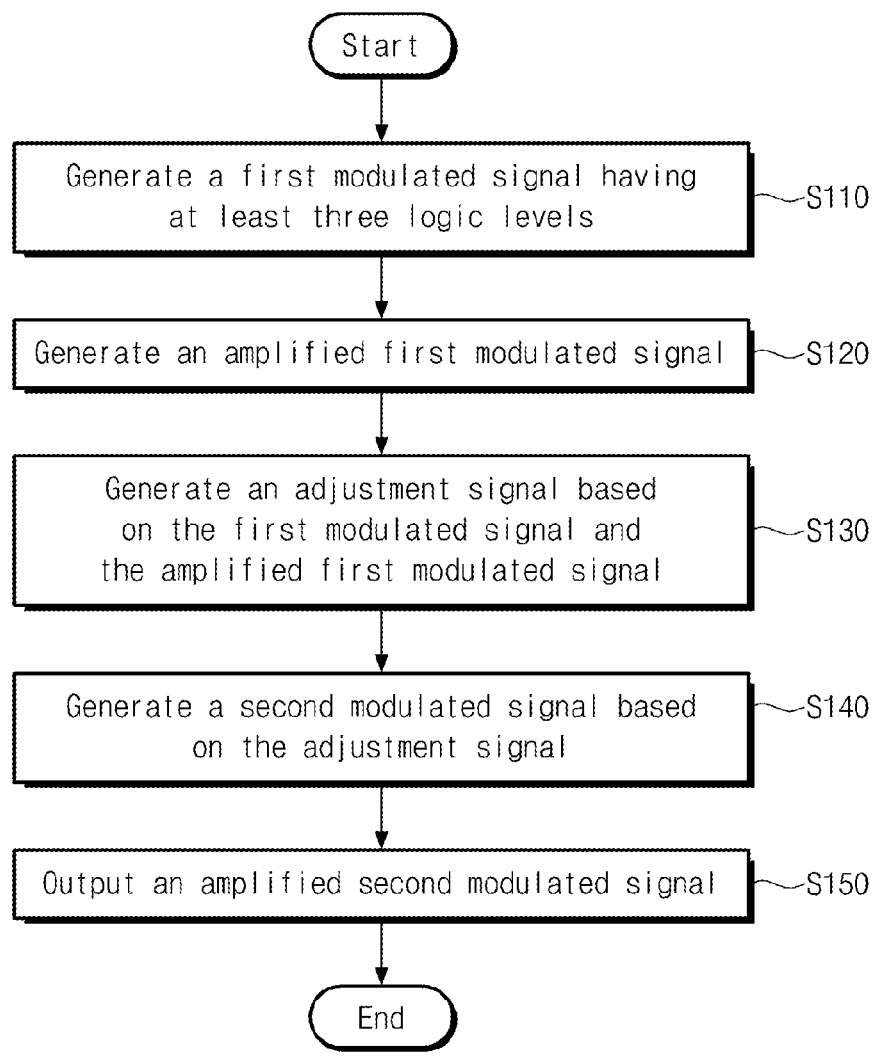

FIG. 11 is a flowchart illustrating a signal transmitting method according to another embodiment of the inventive concept.

In S110, a first modulated signal may be generated. Once an input signal is provided, the first modulated signal may be generated according to an embodiment of the inventive concept. The first modulated signal may have at least three logic levels.

In S120, an amplified first modulated signal may be generated. The amplified first modulated signal may be generated by amplifying the power of the first modulated signal generated in S110. As mentioned above, since a typical power amplification unit has a non-linear output characteristic, the linearity of the amplified first modulated signal may be deteriorated.

In S130, an adjustment signal may be generated. The adjustment signal is a signal for adjusting at least one of electrical characteristic values that respectively correspond to at least three logic levels of the first modulated signal generated in S110. The adjustment signal may be generated based on electrical characteristic values that respectively correspond to at least three logic levels of the first modulated signal generated in S110 and electrical characteristic values that respectively correspond to at least three logic levels of the amplified first modulated signal generated in S120.

In S140, a second modulated signal may be generated. The second modulated signal may be generated based on the adjustment signal generated in S130. The second modulated signal may be generated by adjusting at least one of electrical characteristic values that respectively correspond to at least three logic levels of the first modulated signal generated in S110. In more detail, in order to allow a ratio of differences between each of the electrical characteristic values that respectively correspond to at least three logic levels of the amplified first modulated signal generated in S120 to be identical to that of differences between each of the electrical characteristic values that respectively correspond to at least three logic levels of the first modulated signal generated in S110, at least one of the electrical characteristic values that respectively correspond to at least three logic levels of the first modulated signal may be adjusted. The process of generating an adjustment signal and the process of adjusting an electrical characteristic value corresponding to a logic level of a modulated signal based on the adjustment signal are described with reference to FIGS. 2 and 3.

In S150, an amplified second modulated signal may be outputted. The amplified second modulated signal may be generated by amplifying the power of the second modulated signal generated in S140. As described above, even though a typical power amplification unit has a non-linear output characteristic, the linearity of the amplified second modulated signal may be maintained.

According to an embodiment of the inventive concept, the linearity of an amplified first modulated signal may be degraded. Accordingly, a transmitted signal needs to be implemented not to be included in a first modulated signal according to an embodiment of the inventive concept. It may be desirable that the first modulated signal is implemented to include a signal irrelevant to a transmitted signal. For instance, the first modulated signal may be implemented to be a header signal having a predetermined or arbitrary pattern. In this instance, a header signal may be transmitted while the second modulated signal is being generated.

Figure 12:
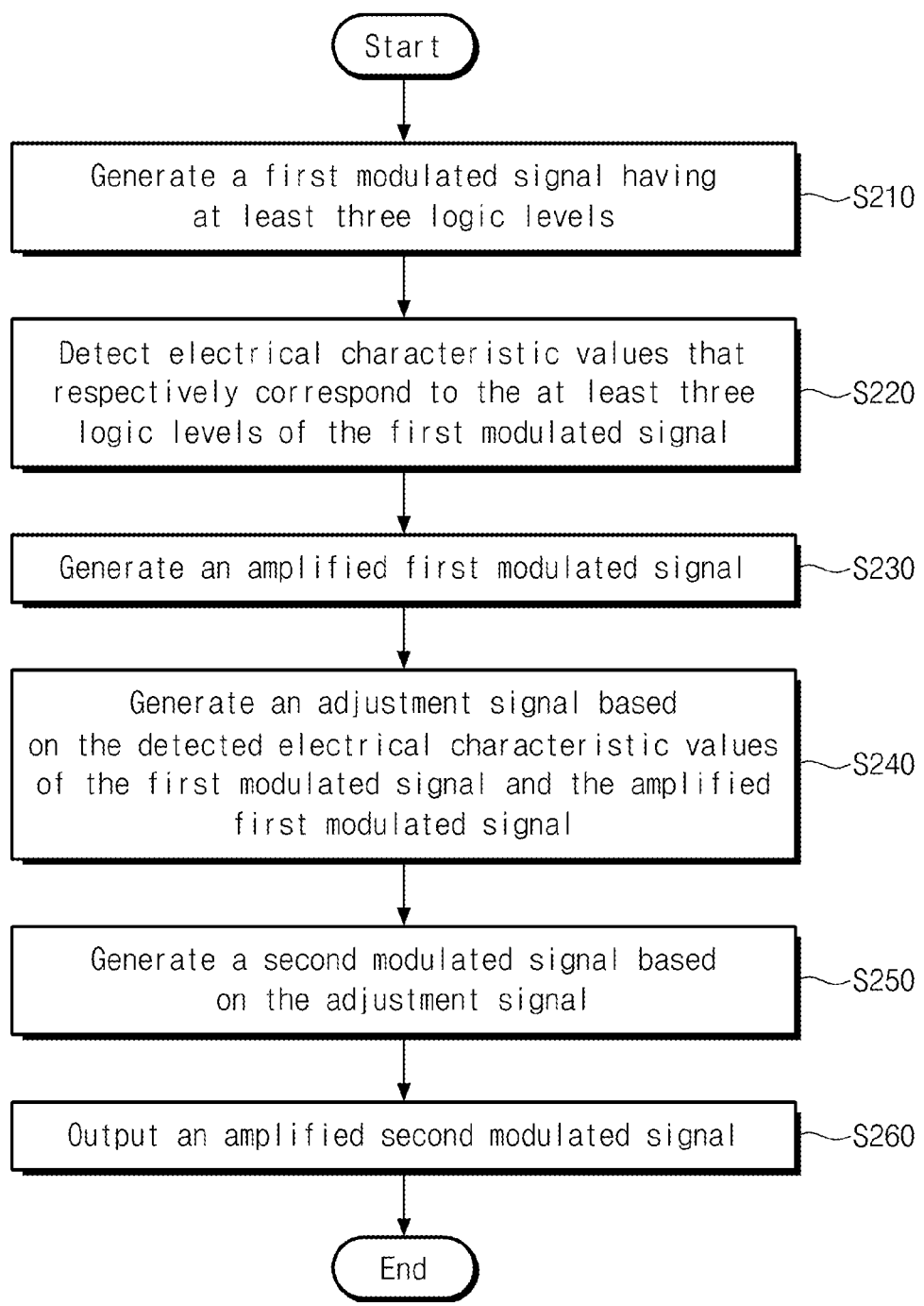

FIG. 12 is a flowchart illustrating a signal transmitting method according to another embodiment of the inventive concept. Operation processes of S210, S230, S240, S250, and S260 may include operation processes of S110, S120, S130, S140, and S150, respectively. In relation to the description of FIG. 11, overlapping descriptions on S210, S230, S240, S250, and S260 are omitted.

In S220, electrical characteristic values that respectively correspond to at least three logic levels of the first modulated signal generated in S210 may be detected. As an embodiment of the inventive concept, electrical characteristic values respectively corresponding to at least three logic levels of the first modulated signal may be detected in real time. Alternatively, the electrical characteristic values respectively corresponding to at least three logic levels of the first modulated signal may be detected at a scheduled time interval and be stored in a storage region.

In S240, an adjustment signal may be generated. In this embodiment, the adjustment signal may be generated based on the electrical characteristic values detected in S220. Detailed description related to this embodiment is made above with reference to FIGS. 5 and 6.

Referring to FIG. 12, S220 is performed before S230. However, the operation order of S220 and S230 is changeable. The reason is why operation processes of S220 and S230 do not affect each other. The content of FIG. 12 is just an embodiment for helping understanding the inventive concept.

Figure 13:
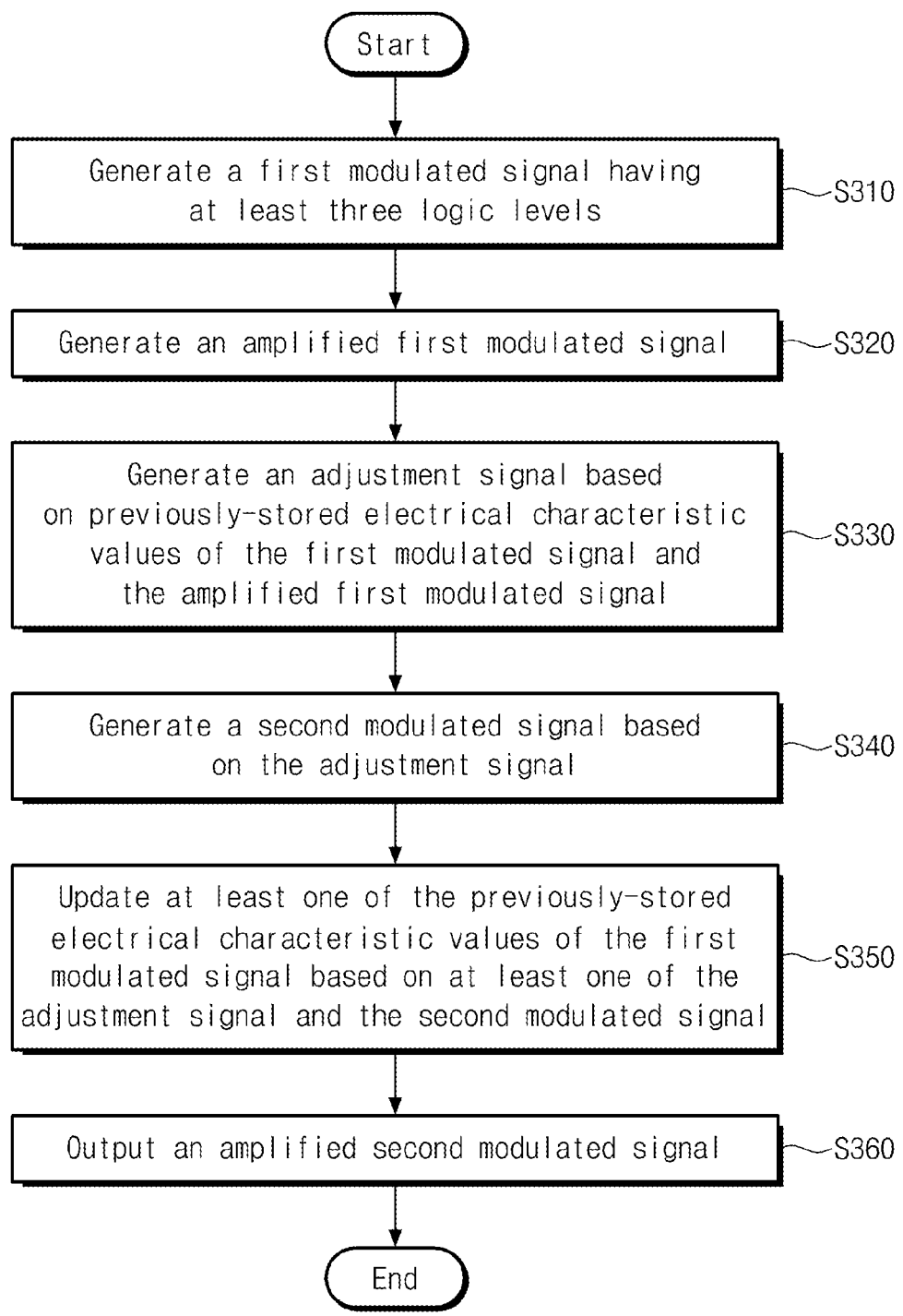

FIG. 13 is a flowchart illustrating a signal transmitting method according to another embodiment of the inventive concept. Operation processes of S310, S320, S330, S340, and S360 may include operation processes of S110, S120, S130, S140, and S150, respectively. In relation to the description of FIG. 11, overlapping descriptions on S310, S320, S330, S340, and S360 are omitted.

In S330, an adjustment signal may be generated. The adjustment signal may be generated based on electrical characteristic values that respectively correspond to at least three logic levels of the first modulated signal generated in S310. In this embodiment, the electrical characteristic values that respectively correspond to at least three logic levels of the first modulated signal may be previously stored before the adjustment signal is generated. As an embodiment of the inventive concept, before the signal transmitting method of FIG. 13 starts, the electrical characteristic values may be stored in a storage region. As another embodiment of the inventive concept, after the first modulated signal is generated in S310, the electrical characteristic values may be stored in a storage region. The adjustment signal may be generated based on the stored electrical characteristic values.

In S350, at least one of the electrical characteristic values may be updated. The stored electrical characteristic values may be updated based on at least one of the adjustment signal generated in S330 and the second modulated signal generated in S340. Detailed description on this embodiment was described with reference to FIGS. 5 and 7.

FIG. 14 is a flowchart illustrating a signal transmitting method according to another embodiment of the inventive concept. Operation processes of S410, S420, S440, S450, and S460 may include operation processes of S110, S120, S130, S140, and S150, respectively. In relation to the description of FIG. 11, overlapping descriptions on S410, S420, S440, S450, and S460 are omitted.

In S430, electrical characteristic values that respectively correspond to at least three logic levels of the first modulated signal generated in S420 may be detected. As an embodiment of the inventive concept, the electrical characteristic values that respectively correspond to at least three logic levels of the first modulated signal may be detected in real time. Alternatively, the electrical characteristic values that respectively correspond to at least three logic levels of the first modulated signal may be detected at a scheduled time interval and be stored in a storage region.

In S440, an adjustment signal may be generated. In this embodiment, the adjustment signal may be generated based on the electrical characteristic value detected in S430. Detailed description related to this embodiment is made above with reference to FIG. 8.

In the signal transmitting method of the inventive concept, at least one of electrical characteristic values that respectively correspond to at least three logic levels of a modulated signal may be adjusted. Thus, the linearity of an amplified modulated signal may be maintained. In order to achieve this advantage, the signal transmitting method of the inventive concept adjusts an electrical characteristic value corresponding to a logic level of a modulated signal, instead of adjusting an entire input signal. Accordingly, the signal transmitting method of the inventive concept may be implemented in a signal transmission device itself separated from a modem. Furthermore, the signal transmitting method of the inventive concept may be implemented according to a simpler algorithm than a typical signal transmitting method.

The inventive concept may be applied to a user terminal requiring high operation efficiency and supporting a multi operation mode or multi operation frequency band. Additionally, the inventive concept may be applied to a transmitter of various sizes of a base station. In particular, the inventive concept may be usefully utilized in a communication system which is based on an Orthogonal Frequency Division Multiplexing (OFDM) fashion and has a high peak to average power ratio. However, this is just an example and the inventive concept may be applied to any communication system using a modulated signal having at least three logical levels.

In relation to a signal transmission device and a signal transmitting method according to embodiments of the inventive concept, the linearity of a modulated signal amplified by a power amplifier included in the signal transmission device may be maintained or improved. Additionally, the signal transmission device may be implemented with a simpler configuration than a typical signal transmission device. Furthermore, the signal transmitting method may be implemented in a signal transmission device itself which is separated from a modem.

Device components illustrated in each block diagram are provided for better understanding of the inventive concept. Each block may be formed of smaller blocks according to functionality. Or, a plurality of blocks may constitute a larger block according to functionality. That is, the inventive concept is not limited to components illustrated in each block diagram.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A signal transmission device comprising:
   a first modulation unit configured to generate a first modulated signal having at least three logic levels, by modulating an input signal;
   a characteristic adjustment unit configured to generate an adjusted first modulated signal by adjusting, based on an adjustment signal, at least one of a plurality of first electrical characteristic values that correspond to the at least three logic levels of the first modulated signal;
   a second modulation unit configured to generate a second modulated signal, by modulating the adjusted first modulated signal, based on a carrier signal;
   a power amplification unit configured to amplify power of the second modulated signal, and to output an amplified second modulated signal; and
   an adjustment operation unit configured to generate the adjustment signal, based on the first electrical characteristic values and based on a plurality of second electrical characteristic values that correspond to at least three logic levels of the amplified second modulated signal;
   wherein the characteristic adjustment unit is configured to adjust the at least one of the first electrical characteristic values, based on the adjustment signal, such that a ratio of differences between each of the second electrical characteristic values is the same as a ratio of differences between each of the first electrical characteristic values.

2. The signal transmission device of claim 1, wherein the first modulation unit is configured to:
   generate the first modulated signal, by using at least one of a delta-sigma modulation and a pulse width modulation.

3. The signal transmission device of claim 1, wherein the first modulation unit is further configured to receive a signal corresponding to amplitude information of the input signal, and
   wherein the second modulation unit is further configured to receive a signal corresponding to phase information of the input signal.

4. The signal transmission device of claim 1, further comprising:
   an initial-characteristic-providing unit configured to provide, to the adjustment operation unit, the first electrical characteristic values.

5. The signal transmission device of claim 1, further comprising:
   an output characteristic detection unit configured to detect the second electrical characteristic values.

6. The signal transmission device of claim 4, wherein the initial-characteristic-providing unit comprises an initial characteristic detector configured to detect the first electrical characteristic values.

7. The signal transmission device of claim 4, wherein the initial-characteristic-providing unit comprises a look-up table configured to store the first electrical characteristic values.

8. The signal transmission device of claim 7, wherein at least one of the electrical characteristic values stored in the look-up table is updated based on at least one of the adjustment signal and the adjusted first modulated signal.

9. A signal transmitting method comprising:
   generating a first modulated signal having at least three logic levels, by modulating an input signal;
   amplifying power of the first modulated signal, thereby generating an amplified first modulated signal;
   generating an adjustment signal, based on a plurality of first electrical characteristic values that correspond to the at least three logic levels of the first modulated signal, and based on a plurality of second electrical characteristic values that correspond to at least three logic levels of the amplified first modulated signal;
   generating a second modulated signal, by adjusting, based on the adjustment signal, at least one of the first electrical characteristic values, such that a ratio of differences between each of the second electrical characteristic values is the same as a ratio of differences between each of the first electrical characteristic values;
   amplifying power of the second modulated signal, and outputting an amplified second modulated signal.

10. The signal transmitting method of claim 9, further comprising:
    detecting the first electrical characteristic values,
    wherein the adjustment signal is generated based on the detected first electrical characteristic values.

11. The signal transmitting method of claim 9,
    wherein the first electrical characteristic values are stored before the adjustment signal is generated, and
    wherein the adjustment signal is generated based on the stored electrical characteristic values.

12. The signal transmitting method of claim 9, further comprising:
    detecting the second electrical characteristic values,
    wherein the adjustment signal is generated based on the detected second electrical characteristic values.

13. The signal transmitting method of claim 11, further comprising:
    updating at least one of the stored electrical characteristic values based on at least one of the adjustment signal and the second modulated signal.

* * * * *